United States Patent
Jeong

(10) Patent No.: US 9,123,426 B2
(45) Date of Patent: Sep. 1, 2015

(54) SEMICONDUCTOR DEVICE INCLUDING FUSE ARRAY

(71) Applicant: SK hynix Inc., Icheon-si Gyeonggi-do (KR)

(72) Inventor: Gwang Young Stanley Jeong, Dublin, CA (US)

(73) Assignee: SK Hynix Inc., Gyeonggi-do (KR)

( * ) Notice: Subject to any disclaimer, the term of this patent is extended or adjusted under 35 U.S.C. 154(b) by 9 days.

(21) Appl. No.: 14/174,363

(22) Filed: Feb. 6, 2014

(65) Prior Publication Data

US 2015/0221393 A1    Aug. 6, 2015

(51) Int. Cl.
*G11C 17/16* (2006.01)
*G11C 17/18* (2006.01)

(52) U.S. Cl.
CPC ............... *G11C 17/16* (2013.01); *G11C 17/18* (2013.01)

(58) Field of Classification Search
CPC ................................. G11C 17/16; G11C 17/18
USPC .......................................................... 365/96
See application file for complete search history.

(56) References Cited

U.S. PATENT DOCUMENTS

| 9,036,445 B1* | 5/2015 | Shin .............................. 365/229 |
| 2002/0075733 A1* | 6/2002 | Zheng et al. ................... 365/200 |
| 2004/0120204 A1* | 6/2004 | Kanda et al. ................ 365/225.7 |
| 2007/0002619 A1 | 1/2007 | Schoenauer et al. |

FOREIGN PATENT DOCUMENTS

KR    1020060087086 A    8/2006

* cited by examiner

*Primary Examiner* — Amir Zarabian
*Assistant Examiner* — Jay Radke
(74) *Attorney, Agent, or Firm* — William Park & Associates Ltd.

(57) ABSTRACT

The semiconductor device includes a control signal driver, a control signal latch unit, an internal driver and a buffer. The control signal driver drives a control signal in response to a fuse reset signal, a fuse set signal and a fuse data. The control signal latch unit is suitable for latching the control signal. The internal driver drives an internal node in response to the control signal, an address signal and a write strobe signal. The buffer buffers a signal of the internal node to generate the redundancy signal.

18 Claims, 2 Drawing Sheets

SEMICONDUCTOR DEVICE INCLUDING FUSE ARRAY

BACKGROUND

1. Technical Field

Embodiments of the present disclosure relate to semiconductor device and more particularly, to the semiconductor device including E-fuse array.

2. Related Art

Semiconductor devices may be regarded as failed devices if at least one of memory cell included in each of the semiconductor devices abnormally operates. As the semiconductor devices become more highly integrated, the number of failed devices has continuously increased. Thus, the semiconductor devices may be designed to include redundancy cells. That is, if a defect of the semiconductor device is found, a repair operation may replace defected cells with the redundancy cells. The semiconductor device may store information on the defected cells therein to execute the repair operation.

Each of the semiconductor devices may be designed to include fuses that store information necessary for various internal control operations, for example, the information on the defected cells. Conventional fuses can be programmed in at wafer level because a logic level of each data is determined according to an electrical open/short state of each fuse. However, once the semiconductor devices are encapsulated to form semiconductor packages, it may be impossible to program the conventional fuses in the semiconductor packages. E-fuses are widely used to solve the aforementioned disadvantage. Each of the e-fuses may be realized using a transistor, for example, a nonvolatile memory (NVM) cell transistor having a floating gate or a charge trapping layer. In such a case, a data may be stored in the e-fuse by programming or erasing the transistor to change a threshold voltage of the transistor. That is, the e-fuse may be considered to be an electrical open or short according to a resistance value between a source and a drain of the transistor employed as the e-fuse.

In order to correctly recognize the data stored in the e-fuses, a size of the transistors employed as the e-fuses has to be increased or amplifiers have to be used without increasing the size of the transistors employed as the e-fuses. However, in any case, there may be limitations in increasing the integration density of the semiconductor devices including the e-fuses.

Recently, e-fuse arrays have been proposed to solve the limitations of the integration density and to store the information necessary for various internal control operations. In the event that the e-fuse arrays are employed in the semiconductor devices, the e-fuse arrays may share the amplifiers with each other. Accordingly, the integration density of the semiconductor devices may be improved.

SUMMARY

Various embodiments are directed to semiconductor devices.

According to an embodiment, a semiconductor device includes a control signal driver, a control signal latch unit, an internal driver and a buffer. The control signal driver drives a control signal in response to a fuse reset signal, a fuse set signal and a fuse data. The control signal latch unit is suitable for latching the control signal. The internal driver drives an internal node in response to the control signal, an address signal and a write strobe signal. The buffer buffers a signal of the internal node to generate the redundancy signal.

According to an embodiment, a semiconductor device includes a fuse data storage unit suitable for outputting a fuse clock signal, the fuse reset signal and the fuse data having information on defected cells in response to an initialization signal; and a fuse lath unit suitable for receiving a fuse set signal generated from the fuse clock signal, the fuse reset signal and the fuse data, to generate a control signal using by the fuse data and to generate a redundancy signal using by driving the control signal.

BRIEF DESCRIPTION OF THE DRAWINGS

Embodiments of the present invention will become more apparent in view of the attached drawings and accompanying detailed description, in which.

DETAILED DESCRIPTION OF THE EMBODIMENTS

Embodiments of the present invention will be described hereinafter with reference to the accompanying drawings. However, the embodiments described herein are for illustrative purposes only and are not intended to limit the scope of the invention.

Figure 1:
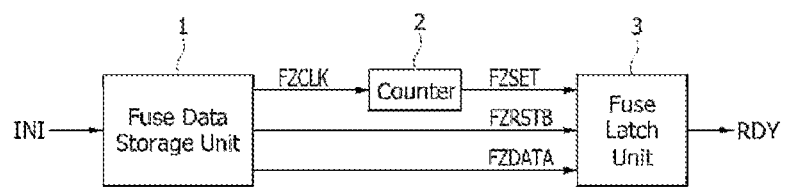
FIG. 1 is a block diagram illustrating a semiconductor device according to some embodiments of the present invention.

Referring to FIG. 1, a semiconductor device according to some embodiments may include a fuse data storage unit 1, a counter 2 and a fuse latch unit 3.

The fuse data storage unit 1 may include a fuse array (not shown) that stores fuse data FZDATA corresponding to information on defected cells, that is, abnormal memory cells. The fuse array may be composed of a plurality of e-fuses or a plurality of the anti fuses. Although this embodiment describes an e-fuse array or an anti-fuse array, the present embodiment is not limited thereto. The fuse data storage unit 1 may be suitable for generating and outputting a fuse reset signal FZRSTB including a pulse in response to an initialization signal INI. The fuse data storage unit 1 may receive the initialization signal INI and may be suitable for generating and outputting a fuse clock signal FZCLK which is toggled. Further, the fuse data storage unit may be suitable for outputting the fuse data FZDATA preset by the e-fuse array. The initialization signal INI may be generated by detecting a level of a power supply voltage signal VDD.

The counter 2 may generate a fuse set signal FZSET in response to counting the fuse clock signal FZCLK. The fuse latch unit 3 may generate a redundancy signal RDY in response to the fuse reset signal FZRSTB, the fuse set signal FZSET and the fuse data FZDATA. Although each of the fuse set signal FZSET, the fuse data FZDATA, the fuse reset signal FZRSTB and the redundancy signal RDY is illustrated as a single signal in FIG. 1 for the purpose of ease and convenience in explanation, each of the fuse set signal FZSET, the fuse data FZDATA, the fuse reset signal FZRSTB and the redundancy signal RDY may be realized to include the same number of signals as the memory cells that are replaced with redundancy cells.

Figure 2:
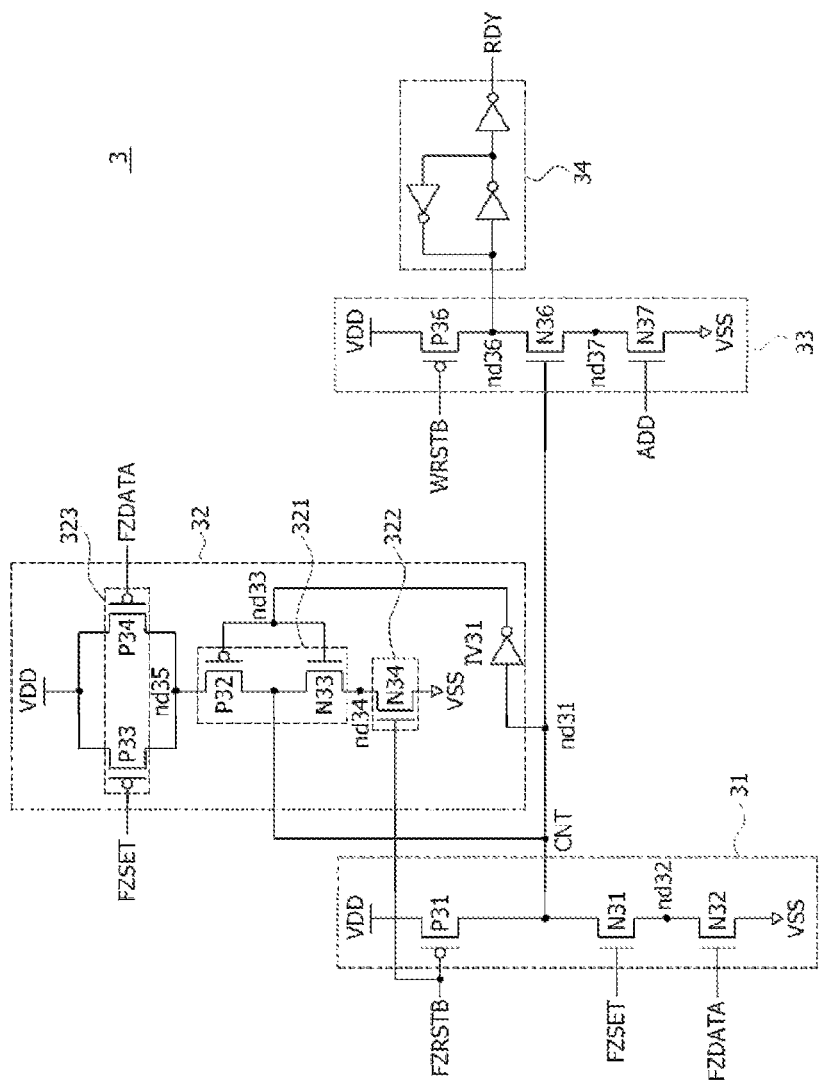
FIG. 2 is a circuit diagram illustrating a fuse latch unit included in the semiconductor device of FIG. 1.

Referring to FIG. 2, the fuse latch unit 3 may include a control signal driver 31, a control signal latch unit 32, an internal driver 33 and a buffer unit 34.

The control signal driver 31 may include a PMOS transistor P31 and NMOS transistors N31 and N32. The PMOS transistor P31 may be coupled between a power supply voltage signal VDD terminal and a node ND31. The PMOS transistor P31 may be turned on in response to the fuse reset signal FZRSTB. The NMOS transistor N31 may be coupled between the node ND31 and a node ND32. The NMOS transistor N31 may be turned on in response to the fuse set signal FZSET. The NMOS transistor N32 may be coupled between the node ND32 and a ground voltage signal VSS terminal. The NMOS transistor N32 may be turned on in response to the fuse data FZDATA. The control signal driver 31 may generate a control signal CNT to have a logic "high" level when a logic "low" level pulse of the fuse reset signal FZRSTB is inputted to the control signal driver 31. The control signal driver 31 may drive the control signal CNT to have a logic "low" level when a logic "high" level pulse of the fuse set signal FZSET is inputted to the control signal driver 31 and the fuse data FZDATA having a logic "high" level is inputted to the control signal driver 31. That is, the control signal CNT may be a voltage level of the node ND31.

The control signal latch unit 32 may include an inverter IV31, a buffer 321, a first drive controller 322 and a second drive controller 323. The inverter IV31 may act as a buffer that buffers a signal (i.e., the control signal CNT) of the node ND31 to output the buffer control signal to a node ND33. The buffer 321 may be coupled between a node ND34 and a node ND35. The buffer 321 may buffer a signal of the node ND 33 to output the buffered signal to the node ND31 as the control signal CNT. The buffer 321 may include a PMOS transistor P32 and an NMOS transistor N33. The PMOS transistor P32 may act as a pull-up driving element that pulls up a level of the node ND31 in response to a signal of the node ND33. The NMOS transistor N33 may act as a pull-down driving element that pulls down a level of the node ND31 in response to a signal of the node ND33. The first drive controller 322 may be coupled between the node ND34 and the ground voltage VSS terminal. The first drive controller 322 may be suitable for including an NMOS transistor N34. The NMOS transistor N34 may be turned off to terminate a pull-down operation of the NMOS transistor N33 when the fuse reset signal FZRSTB has a logic "low" level. The second drive controller 323 may be coupled between the power supply voltage signal VDD terminal and the node ND35. The second drive controller 323 may be suitable for including PMOS transistors P33 and P34 which are connected in parallel. Both the PMOS transistors P33 and P34 may be turned off to terminate a pull-up operation of the PMOS transistor P32 when both the fuse set signal FZSET and the fuse data FZDATA have a logic "high" level.

The internal driver 33 may include a PMOS transistor P36 and NMOS transistors N36 and N37. The PMOS transistor P36 may be coupled between the power supply voltage signal VDD terminal and a node ND36. The PMOS transistor P36 may be turned on in response to an initialization signal, for example write strobe signal WRSTB. The NMOS transistor N36 may be coupled between the node ND36 and a node ND37. The NMOS transistor N36 may be turned on in response to the control signal CNT in the node ND 31. The NMOS transistor N37 may be coupled between the node ND37 and the ground voltage signal VSS terminal. The NMOS transistor N37 may be turned on in response to an address signal ADD. The internal driver 33 may drive a signal of the node ND36 to have a logic "high" level when a logic "low" level pulse of the initialization signal WRSTB is inputted to the internal driver 33. The internal driver 33 may drive a signal of the node ND36 to have a logic "low" level if the control signal CNT has a logic "high" level while the address signal ADD having a logic "high" level is inputted to the internal driver 33. The buffer 34 may latch a signal of the node ND36. The buffer 34 may buffer the latched signal to generate the redundancy signal RDY.

The operation of the semiconductor device having the aforementioned configuration will be described hereinafter with reference again to FIG. 1 and FIG. 2.

The fuse data storage unit 1 may receive the initialization signal INI. The fuse data storage unit 1 is suitable for generating the fuse reset signal FZRSTB and to generate the fuse clock signal FZCLK which is toggled by properly processing the initialization signal INI. Further, the fuse data storage unit 1 may store preset a-preset fuse data FZDATA and provide the fuse data FZDATA stored therein to the fuse latch unit 3. The counter 2 may output the fuse set signal FZSET, which is determined by counting the fuse clock signal FZCLK, to the fuse latch unit 3.

The fuse latch unit 3 may generate the redundancy signal RDY in response to the fuse reset signal FZRSTB, the fuse set signal FZSET and the fuse data FZDATA.

The control signal driver 31 of the fuse latch unit 3 is suitable for outputting the control signal CNT. That is, the latch operation of the control signal CNT in the fuse latch unit 3 may be controlled by the fuse reset signal FZRSTB, the fuse set signal FZSET and the fuse data FZDATA. When the control signal CNT is pulled up by a logic "low" level pulse of the fuse reset signal FZRSTB in the control signal driver 31, the control signal latch unit 32 may terminate a pull-down operation of the control signal CNT. In addition, when the control signal CNT is pulled down by a logic "high" level pulse of the fuse set signal FZSET and the fuse data FZDATA having a logic "high" level in the control signal driver 431, the control signal latch unit 32 may terminate a pull-up operation of the control signal CNT.

As described above, the semiconductor device according to an embodiment may drive and latch the control signal CNT using the fuse data FZDATA that include information on the defected cells, that is, the abnormal memory cells. In particular, while the control signal CNT is driven, a latch operation of the control signal CNT may be terminated to prevent the signals in the fuse latch unit 3 from colliding or fighting with each other. As a result, malfunction of the semiconductor device may be prevented.

The embodiments have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor device comprising:
   a control signal driver suitable for driving a control signal in response to a fuse reset signal, a fuse set signal and fuse data;
   a control signal latch unit suitable for latching the control signal in response to the fuse set signal and the fuse data;
   an internal driver suitable for driving an internal node in response to the control signal, an address signal and a write strobe signal; and
   a buffer suitable for buffering a signal of the internal node to generate a redundancy signal.

2. The semiconductor device of claim 1, wherein the fuse set signal is a signal generated by counting the fuse clock signal.

3. The semiconductor device of claim 1, further comprising:
   a fuse data storage unit suitable for generating a fuse clock signal, the fuse reset signal and the fuse data in response to an initialization signal.

4. The semiconductor device of claim 1, wherein an initialization signal is generated by detecting a level of a power supply voltage signal.

5. The semiconductor device of claim 3, wherein the fuse data storage unit includes a fuse array that stores the fuse data.

6. The semiconductor device of claim 1,
wherein the control signal driver is suitable for driving the control signal to a first level when a pulse of the fuse reset signal is inputted to the control signal driver; and
wherein the control signal driver is suitable for driving the control signal to a second level being opposite to the first level when the fuse data is inputted to the control signal driver while the pulse of the fuse set signal is inputted to the control signal driver.

7. The semiconductor device of claim 6, wherein the control signal latch unit is suitable for terminating an operation of latching the control signal while the control signal is driven to have the second level.

8. The semiconductor device of claim 6, wherein the control signal latch unit includes:
a first buffer suitable for buffering a signal of a first node through which the control signal is outputted to transmit the buffered signal to a second node;
a second buffer suitable for buffering a signal of the second node to transmit the buffered signal to the first node;
a first drive controller suitable for controlling a drive of the second buffer in response to the fuse reset signal; and
a second drive controller suitable for controlling a drive of the second buffer in response to the fuse set signal and the fuse data.

9. The semiconductor device of claim 8, wherein the second buffer includes:
a pull-up driving element suitable for pulling up the first node in response to the signal of the second node; and
a pull-down driving element suitable for pulling down the first node in response to the signal of the second node.

10. The semiconductor device of claim 9, wherein the first drive controller is suitable for controlling the pull-down driving element.

11. The semiconductor device of claim 10, wherein the second drive controller is suitable for controlling the pull-up driving element.

12. The semiconductor device of claim 6, wherein the internal driver is suitable for determining whether the internal node has to be driven to have the second level according to a level of the control signal while the address signal is inputted after the internal node is driven to have the first level in response to an initialization signal.

13. A semiconductor device comprising:
a fuse data storage unit suitable for outputting a fuse clock signal, a fuse reset signal and fuse data stored within the fuse data storage unit having information on defected cells in response to an initialization signal; and
a fuse latch unit suitable for receiving a fuse set signal generated from the fuse clock signal, the fuse reset signal and the fuse data, to generate a control signal in response to the fuse data and to generate a redundancy signal in response to the control signal, wherein the control signal is latched in response to fuse set signal and the fuse data.

14. The semiconductor device of claim 13, further comprising:
a counter suitable for generating the fuse set signal by counting the fuse clock signal.

15. The semiconductor device of claim 14, wherein the fuse latch unit comprises:
a control signal driver suitable for driving the control signal in response to the fuse reset signal, the fuse set signal and the fuse data;
a control signal latch unit suitable for receiving the control signal and to latch the control signal;
an internal driver suitable for receiving the latched control signal and drive an internal node of the internal driver in response to the control signal, the address signal and a write strobe signal; and
a buffer suitable for buffering a signal of the internal node corresponding to an output signal of the internal driver to generate the redundancy signal.

16. The semiconductor device of claim 15,
wherein the control signal driver is suitable for outputting the control signal having a high level when the fuse reset signal is enabled to a low level, and to output the control signal having a low level when the fuse set signal and the fuse data are enabled to a high level.

17. The semiconductor device of claim 16, wherein the control signal latch unit is suitable for being terminated when the fuse reset signal is enabled to the low level, or when the fuse set signal and the fuse data is enable to the high level.

18. The semiconductor device of claim 13, wherein the fuse data storage unit is suitable for storing the fuse data having the information on the defected cells.

* * * * *